(12) United States Patent
Sasaki et al.

(10) Patent No.: US 9,099,764 B2
(45) Date of Patent: Aug. 4, 2015

(54) ELECTRONIC CIRCUIT AND ELECTRONIC DEVICE

(71) Applicant: Kabushiki Kaisha Toshiba, Minato-ku (JP)

(72) Inventors: Tadahiro Sasaki, Tokyo (JP); Hiroshi Yamada, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/183,720

(22) Filed: Feb. 19, 2014

(65) Prior Publication Data

US 2014/0240055 A1 Aug. 28, 2014

(30) Foreign Application Priority Data

Feb. 27, 2013 (JP) ................................. 2013-036907

(51) Int. Cl.
*H01P 1/212* (2006.01)
*H05K 1/02* (2006.01)
*H01P 1/20* (2006.01)

(52) U.S. Cl.
CPC .............. *H01P 1/212* (2013.01); *H01P 1/2005* (2013.01); *H05K 1/0236* (2013.01); *H05K 1/0298* (2013.01)

(58) Field of Classification Search
CPC ..... H01P 1/2005; H01P 1/212; H05K 1/0236; H05K 1/0298
See application file for complete search history.

(56) References Cited

U.S. PATENT DOCUMENTS

| | | | |
|---|---|---|---|
| 8,779,874 B2* | 7/2014 | Toyao | 333/204 |
| 8,952,266 B2* | 2/2015 | Toyao | 174/262 |
| 2003/0034860 A1 | 2/2003 | Nakamura et al. | |
| 2006/0082424 A1 | 4/2006 | Chang | |
| 2008/0048799 A1 | 2/2008 | Wang et al. | |
| 2010/0073109 A1 | 3/2010 | Wu et al. | |
| 2013/0050044 A1 | 2/2013 | Inoue | |
| 2013/0068515 A1* | 3/2013 | Toyao et al. | 174/260 |
| 2013/0140071 A1* | 6/2013 | Toyao et al. | 174/260 |
| 2013/0256009 A1 | 10/2013 | Sasaki et al. | |
| 2014/0028412 A1 | 1/2014 | Sasaki et al. | |
| 2014/0029227 A1 | 1/2014 | Sasaki et al. | |

FOREIGN PATENT DOCUMENTS

JP 2003-60404 2/2003
WO WO 2011152054 A1 * 12/2011

OTHER PUBLICATIONS

Extended Search Report issued May 30, 2014 in European Patent Application No. 14154827.1.
Korean Office Action mailed on Mar. 24, 2015 in counterpart Korean Patent Application No. 10-2014-20289, with English translation, citing documents AX and AY therein, 7 pages.

(Continued)

*Primary Examiner* — Patrick O'Neill
(74) *Attorney, Agent, or Firm* — Oblon, McClelland, Maier & Neustadt, L.L.P.

(57) ABSTRACT

An electronic circuit according to an embodiment includes a power supply line having a first EBG pattern, the first EBG pattern including a plurality of first linear parts and a first slit, each of the first linear parts extending along a direction in which the power supply line extends and surrounded by the first slit except one end of the first linear part.

14 Claims, 12 Drawing Sheets

(56) References Cited

OTHER PUBLICATIONS

Dongsheng La, et al., "A Novel Compact Bandstop Filter using Defected Microstrip Structure," Mircowave and Optical Technology Letters, vol. 53, No. 2, Feb. 2011, pp. 433-435.

Jongwha Kwon, et al., "Research Trends on Technology for Reducing Electromagnetic Interference using EBG Structure," Journal of Korean Institute of Electromagnetic Engineering and Science, vol. 18, No. 1, Jan. 2007, pp. 32-42.

* cited by examiner

FIG.1

Extending Direction

Extending Direction

Extending Direction

ELECTRONIC CIRCUIT AND ELECTRONIC DEVICE

CROSS-REFERENCE TO RELATED APPLICATION

This application is based upon and claims the benefit of priority from Japanese Patent Application No. 2013-036907, filed on Feb. 27, 2013, the entire contents of which are incorporated herein by reference.

FIELD

Embodiments described herein relate generally to an electronic circuit and an electronic device.

BACKGROUND

Noise transmitting on a power supply line causes malfunction to a circuit board in which digital, analogue and RF mixed circuit, SOC (system on chip), pseud-SOC and etc. are mounted. In order to prevent the malfunction, it is proposed to provide a filter using a microstrip line or three dimensional EBG (Electromagnetic Band Gap) structure.

However, it is required that a ground plane, which is to be a reference plane, should come close to the microstrip line. Therefore, a restriction on the arrangement of the filter will be enhances. In addition, a filter pattern with small area capable of cutting low frequency signals has not been realized yet. Thus, it leads to the problem in miniaturization of a circuit board, etc.

In addition, it is necessary to avoid three dimensional structure when forming a connection part such as a through via in three dimensional EBG structure. In addition, an EBG structure with small area capable of cutting low frequency signals has not been realized yet. Thus, it leads to the problem in miniaturization of a circuit board, etc. Thus, it leads to the problem in miniaturization of a circuit board as well.

DETAILED DESCRIPTION

An electronic circuit according to an embodiment comprises a power supply line having a first EBG pattern, the first EBG pattern including a plurality of first linear parts and a first slit, each of the first linear parts extending along a direction in which the power supply line extends and surrounded by the first slit except one end of each of the first linear parts.

An electronic circuit in the specification includes both an electronic circuit which is configured in a semiconductor device or in a semiconductor chip, and an electronic circuit using a circuit board.

A circuit board in the specification refers to the one in which one or more electronic components are mounted on printed wiring boards.

A First Embodiment

An electronic circuit according to the present embodiment comprises an power supply line. The power supply line has a first EBG pattern. The first EBG pattern includes a plurality of first linear parts and a first slit, each of the first linear parts extends along a direction in which the power supply line extends and surrounded by a first slit except one end of each of the first linear part.

Figure 1:
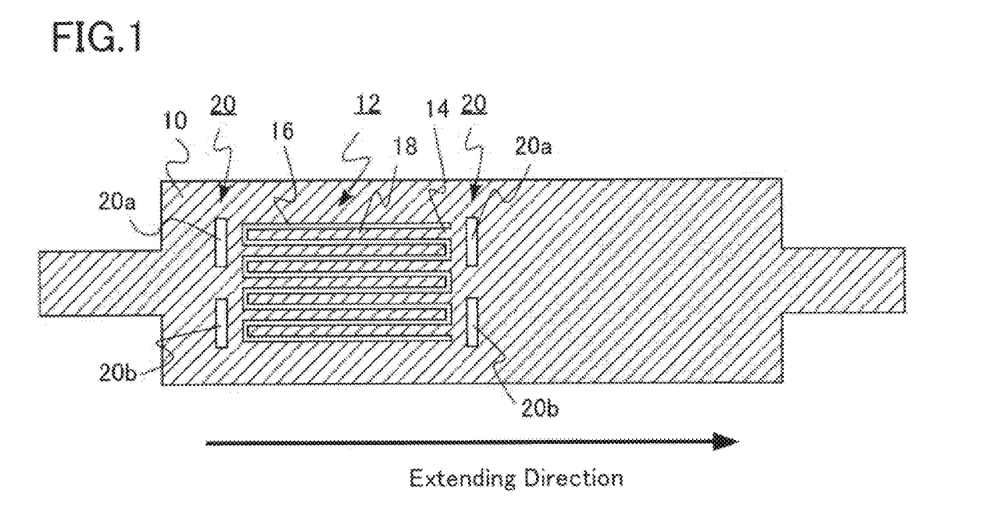
FIG. 1 shows an EBG pattern of an EBG structure provided in a power supply line according to a first embodiment.

FIG. 1 shows the EBG pattern of an EBG structure provided in the power supply line according to the present embodiment.

A power supply line 10 provides electric voltage or electric current to an element in an electronic circuit. A power supply line 10 is an electric conductor, and preferably is metal. Preferably, the metal is a low resistivity metal such as Copper (Cu), Gold (Au), Aluminum (Al) or Ag (Silver).

A first EBG pattern 12 is formed in the power supply line 10. The first EBG pattern 12 has a plurality of first linear parts 18 and a first slit 16. Each of the first linear parts 18 is surrounded by the first slit 16 except one end 14 of each of the first linear parts 18. First linear parts 18 extend along a direction in which the power supply line 10 extends. The direction (extending direction) in which the power supply line 10 extends is also a direction in which an electric current flows. The first linear parts 18 are arranged perpendicular to the direction in which the power supply line 10 extends. In FIG. 1, four first linear parts 18 are provided. The number of the first linear parts 18 is not limited to four.

Noise transmitting on the power supply line 10 is cut by the first EBG pattern 12. By increasing a number of the first linear parts 18, the amount of the cut noise can be increased.

In addition, a plurality of slit parts 20 are provided on the power supply line 10. The second slit parts 20 are provided on both sides of the first EBG pattern 12. The first EBG pattern 12 is interposed between the slit parts 20. Each of the slit parts 20 is has a pair of slits 20a and 20b which are arranged substantially perpendicular to the direction in which the power supply line 10 extends, and each of slits 20a and 20b extends substantially perpendicular to the direction in which the power supply line 10 extends.

The slit parts 20 are provided to make fine adjustments of the cutoff frequency band of the first EBG pattern 12. The widths of the pair of slits 20*a* and 20*b* in the left side of the first EBG pattern can be different from that in the right side.

Figure 2A:
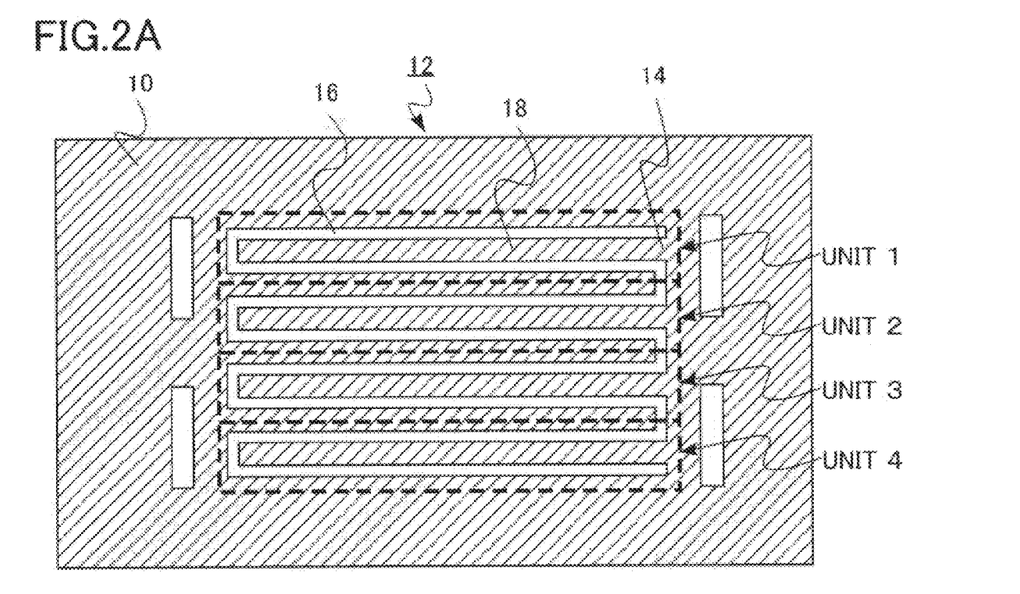
FIGS. 2A to 2C are explanatory views of an equivalent circuit of the EBG structure according to the first embodiment.
Figure 2B:
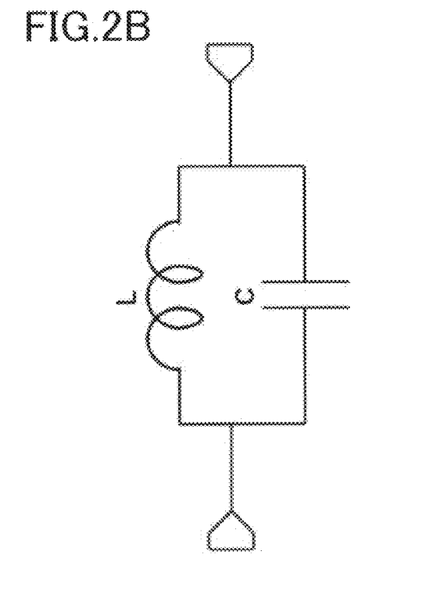
Figure 2C:
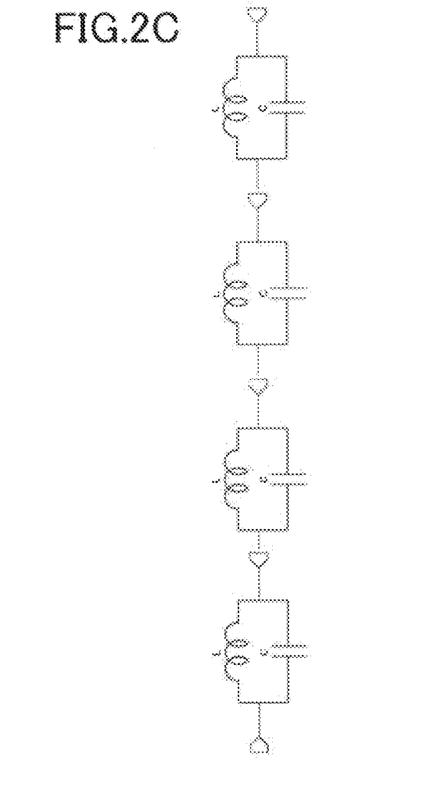

FIGS. 2A to 2C are explanatory views for an equivalent circuit of the EBG structure according to the present embodiment. FIG. 2A is a pattern figure of the EBG structure, FIG. 2B is an explanatory view of an equivalent circuit of one unit, and FIG. 2C is an explanatory view of an equivalent circuit combining unit 1 to unit 4.

In unit 1, the EBG pattern of an EBG structure comprises a fringe parasitic inductance component derived from an outer edge of the first slit 16 and a fringe parasitic capacitance component between the outer edge of the first slit 16 and one of the first liner parts 18. As described in FIG. 2B, the electronic circuit of the EBG structure is a LC parallel resonant circuit in which the fringe parasitic inductance component and the fringe parasitic capacitance component are connected in parallel. In addition, as described in FIG. 2C, if unit 1 to unit 4 is connected, it is an electronic circuit in which four LC parallel resonant circuits are connected in series.

By the first EBG pattern comprising the one described above, cutting of the desired frequency signals and reducing the noise on the power supply line 10 can be made possible. Here, the resonant frequency of the electronic circuit constituted by the first EBG pattern will be the cutoff frequency by the first EBG pattern.

Figure 3:
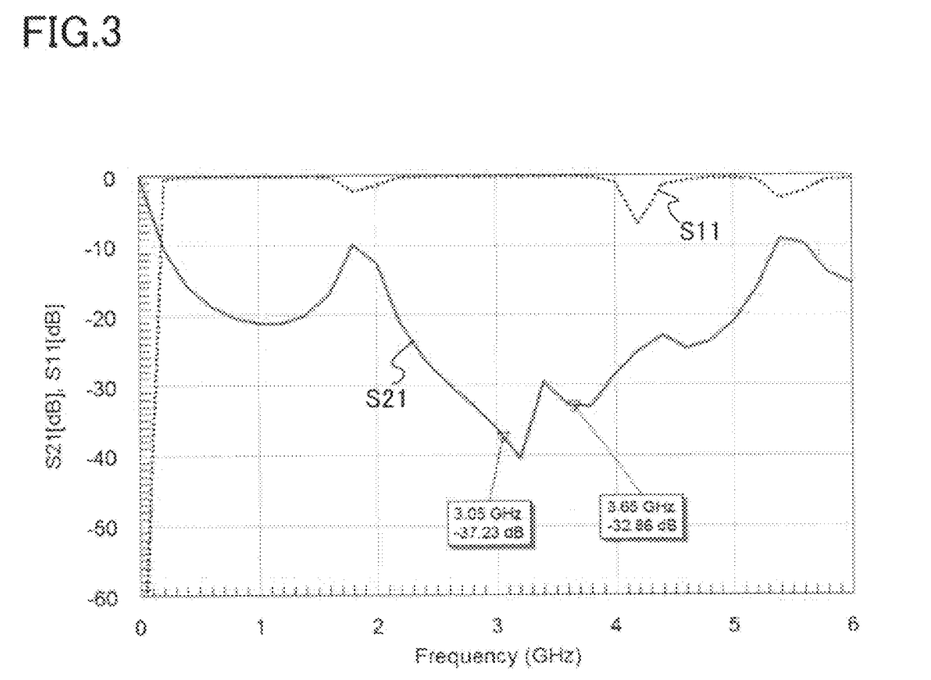
FIG. 3 shows cutoff characteristics according to the first embodiment.

FIG. 3 shows cutoff characteristics according to the present embodiment. As shown in the figure, cutoff characteristics whose maximum cutoff frequency is 3.2 GHz is obtained.

Figure 4:
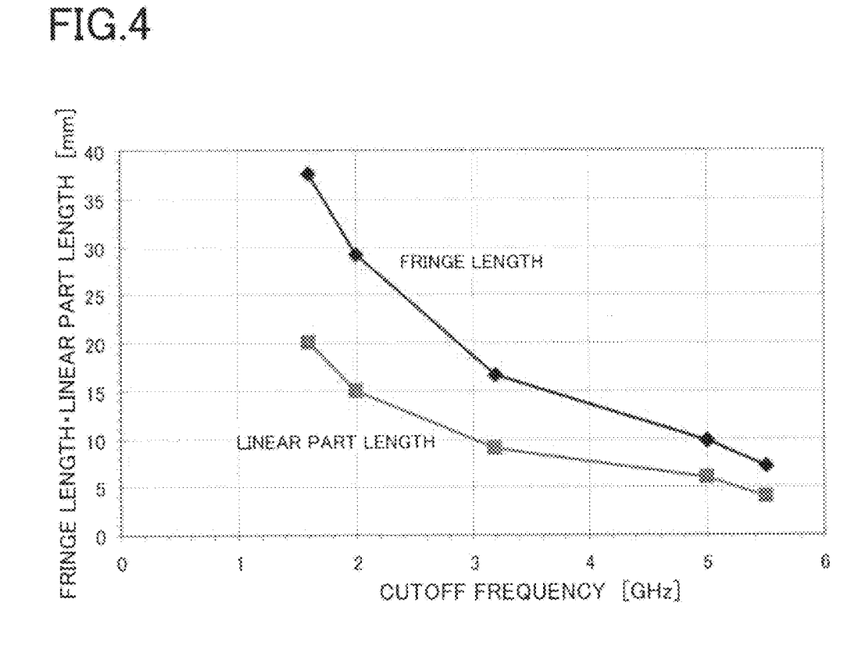
FIG. 4 shows a relationship between the EBG pattern of an EBG structure and cutoff frequency according to the first embodiment.

FIG. 4 shows a relationship between the EBG pattern according to the present embodiment and its cutoff frequency. FIG. 4 shows the relationship between the length of one of the linear parts of the pattern (linear part length), the length of the fringe (fringe length), and the maximum cutoff frequency. The linear part length described here is a length of one of the first linear parts 18, and the fringe length is a length of the outer edge of the first slit part 16 which encloses one of the first linear parts 18. By optimizing the linear part length and the fringe length, the preferable cutoff frequency can be adjusted.

The EBG structure according to the present embodiment forms a LC resonant circuit by the slits provided on the two-dimensional conductor, i.e., the power supply line 10. Thus, for example, compared with the three-dimensional EBG structure forming the LC resonant circuit by the three-dimensional structure, smaller electronic circuit can be made possible.

Figure 5:
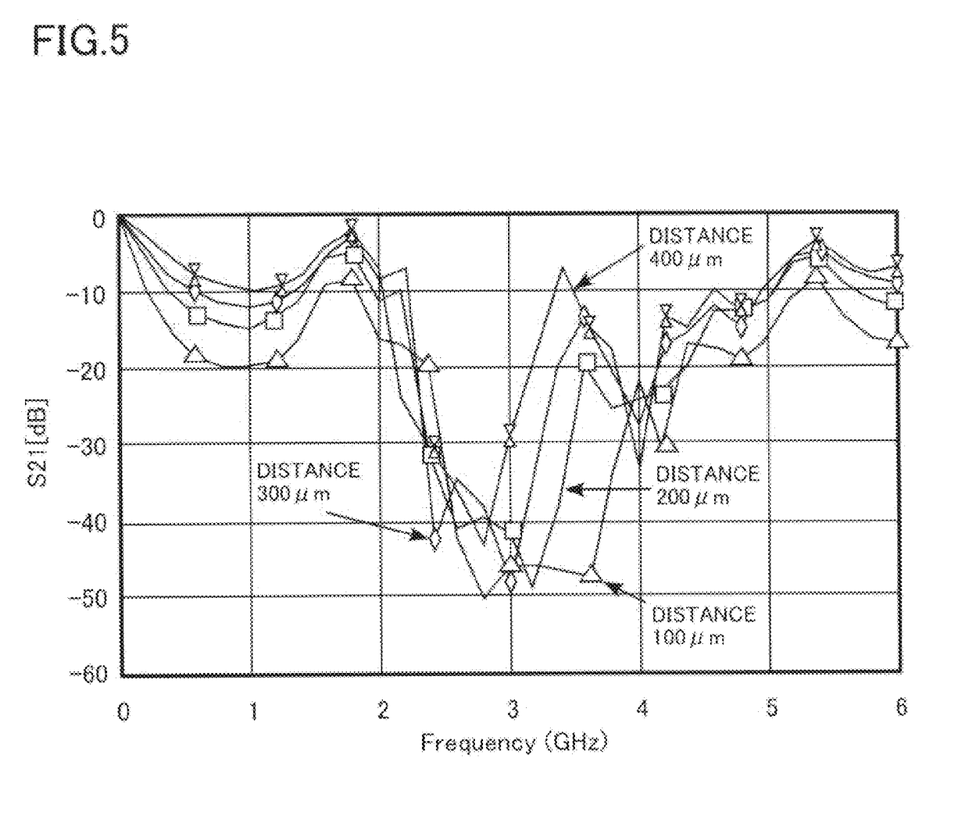
FIG. 5 shows a relationship between the distance from the power supply line to a reference plane and cutoff characteristics according to the first embodiment.

FIG. 5 shows a relationship between the distance between the power supply line, a reference plane, and the cutoff characteristics according to the present embodiment. As shown in FIG. 5, the distance between the power supply line and the reference plane in which the return current flows is defined as a variable, and is changed between 100 um and 400 um inclusive. As shown in FIG. 5, it is confirmed that a reduction of −40 dB can be achieved irrelevant to the distance. Here, the reference plane is a ground plane formed by an electric conductor. The ground plane is spaced apart from the power supply line and formed by an electric conductor.

In this way, according to the present embodiment, cutoff of the noise in the power supply line can be effectively made possible by the EBG structure, even though the distance between the power supply line and the reference plane is long. Thus, for example, the degree of freedom in the position of the EBG structure in the multilayered circuit board is improved. Hence, the minimization of an electronic circuit size can also be made possible in this aspect as well.

By applying the EBG structure according to the present embodiment, an electronic circuit which is small and whose malfunction of the noise transmitting on the power supply line is reduced can be realized.

A Second Embodiment

An electronic circuit according to the present embodiment is similar except for the fact that the power supply line has a second EBG pattern. The second EBG pattern has identical pattern as the first EBG pattern. The first EBG pattern and the second EBG pattern are arranged along the direction in which the power supply line extends. Thus, the contents which overlap those in the first embodiment are omitted.

Figure 6A:
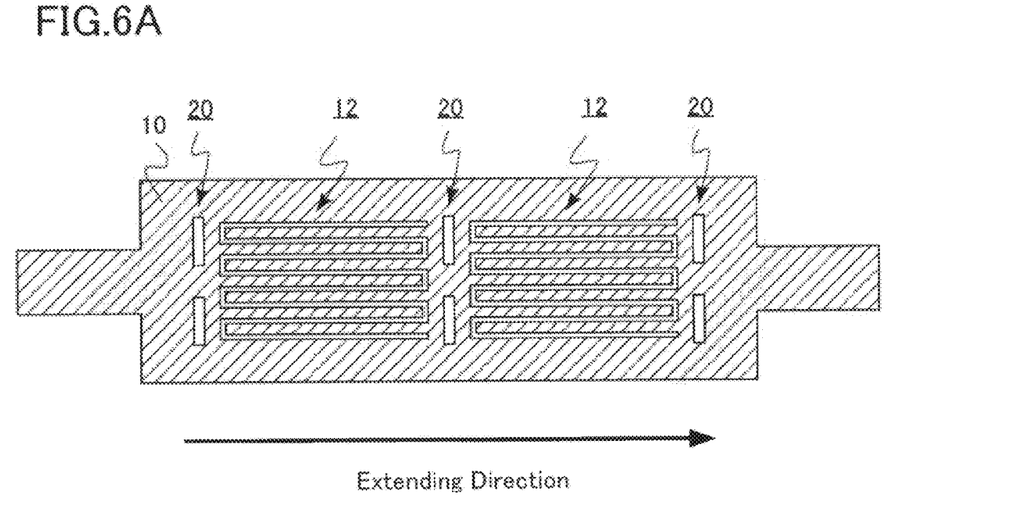
FIGS. 6A to 6B show an EBG pattern of an EBG structure provided in a power supply line according to a second embodiment.
Figure 6B:
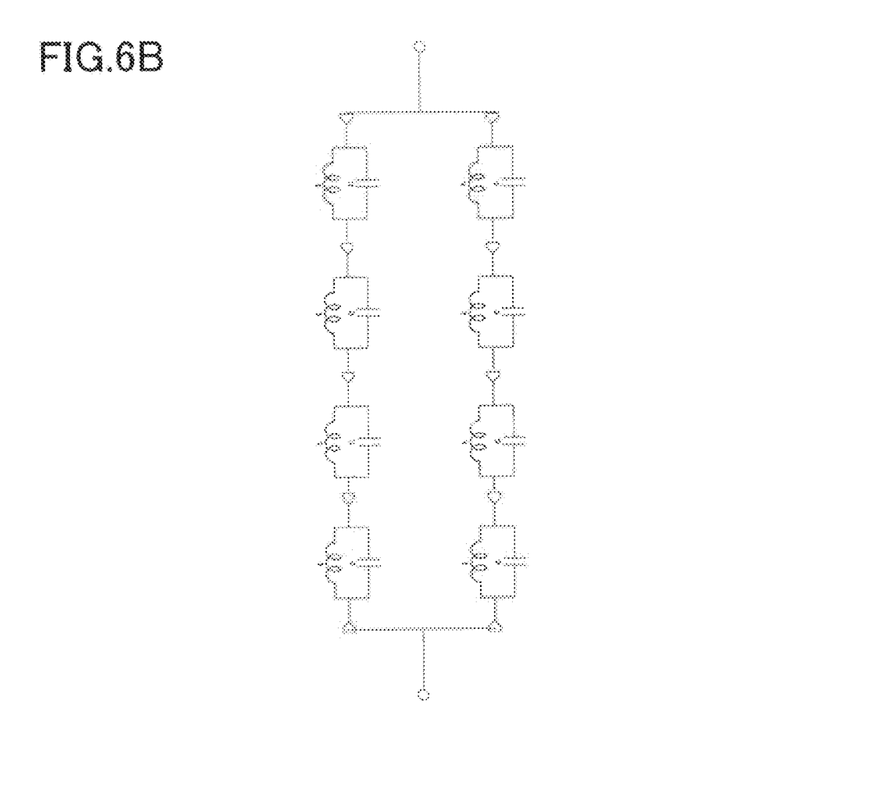

FIGS. 6A-6B show an EBG structure provided in a power supply line according to the present embodiment. FIG. 6A shows an EBG pattern of an EBG structure and FIG. 6B shows an equivalent circuit.

As shown in FIG. 6A, the first EBG pattern 12 described in the first embodiment and second EBG pattern 12 identical to the first EBG pattern 12 are arranged in the direction in which the power supply line extends. In other words, two first EBG patterns 12 are arranged in the direction in which the power supply line extends. As shown in the equivalent circuit in FIG. 6B, the electronic circuit in which four LC parallel resonant circuits in series is further connected in parallel in the present embodiment.

According to the present embodiment, the amount of the cutoff of the noise can be increased by disposing two first EBG patterns 12 in the direction in which the power supply line extends. Additionally, disposing more than three first EBG patterns 12 may be possible to further increase the reduction amount.

A Third Embodiment

An electronic circuit according to the present embodiment is identical to the first embodiment except for the fact that the power supply line has the third EBG pattern. The third EBG part includes a plurality of second linear parts and a second slit. Each of the second linear parts extends along a direction in which the power supply line extends and surrounded by the second slit except one end of each of the second linear part. Length of second linear parts is different from that of the first linear parts. The first EBG pattern and the third EBG pattern are arranged along the direction in which the power supply line extends. The contents which overlap those in the first embodiment are omitted.

Figure 7:
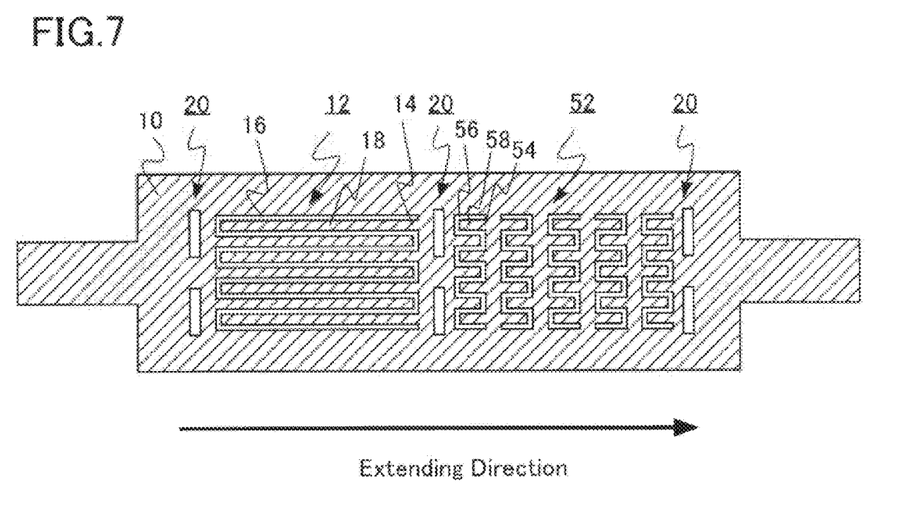
FIG. 7 shows an EBG pattern of an EBG structure provided in a power supply line according to a third embodiment.

FIG. 7 shows an EBG pattern of an EBG structure provided in the power supply line according to the present embodiment.

As shown in FIG. 7, the power supply line 10 in the present embodiment have the first EBG pattern 12 described in the first embodiment and a third EBG pattern 52. The third EBG pattern includes a plurality of second linear parts 58 and a second slit 56. Each of the second linear part 58 extends along the direction in which the power supply line extends and is surrounded by a second slit 56 except the one end 54 of each of the second linear part 58. Length of each of the second linear part 58 is different from that of first linear parts 18. Here, length of each of the second linear part 58 is shorter than that of first linear parts 18. And the first EBG pattern 12 and the third EBG pattern 52 are arranged along the direction in which the power supply line extends.

Figure 8:
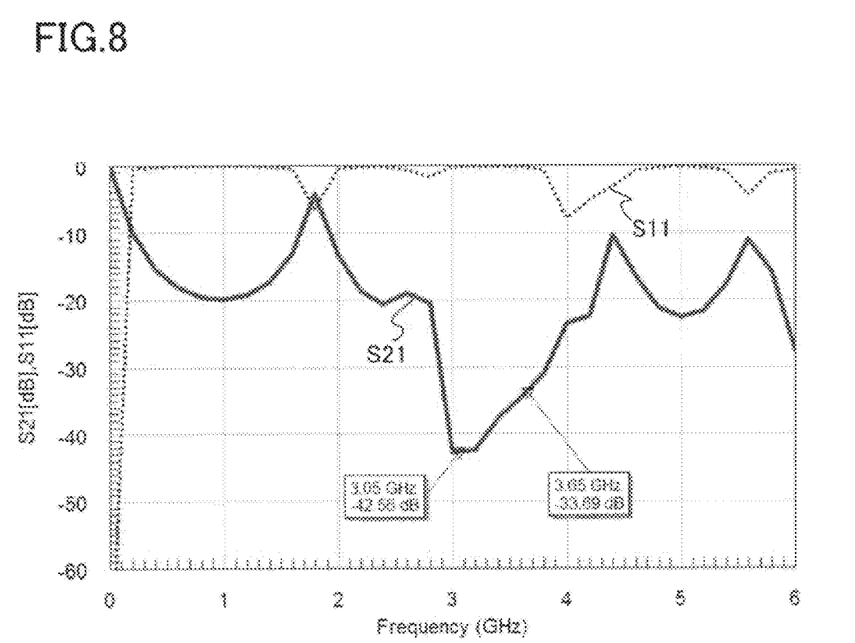
FIG. 8 shows cutoff characteristics according to the third embodiment.

FIG. 8 shows cutoff characteristics according to the present embodiment. As shown in FIG. 8, cutoff characteristics in which the maximum cutoff frequency is between 3.0 GHz to 3.2 GHz inclusive is obtained.

Figure 9A:
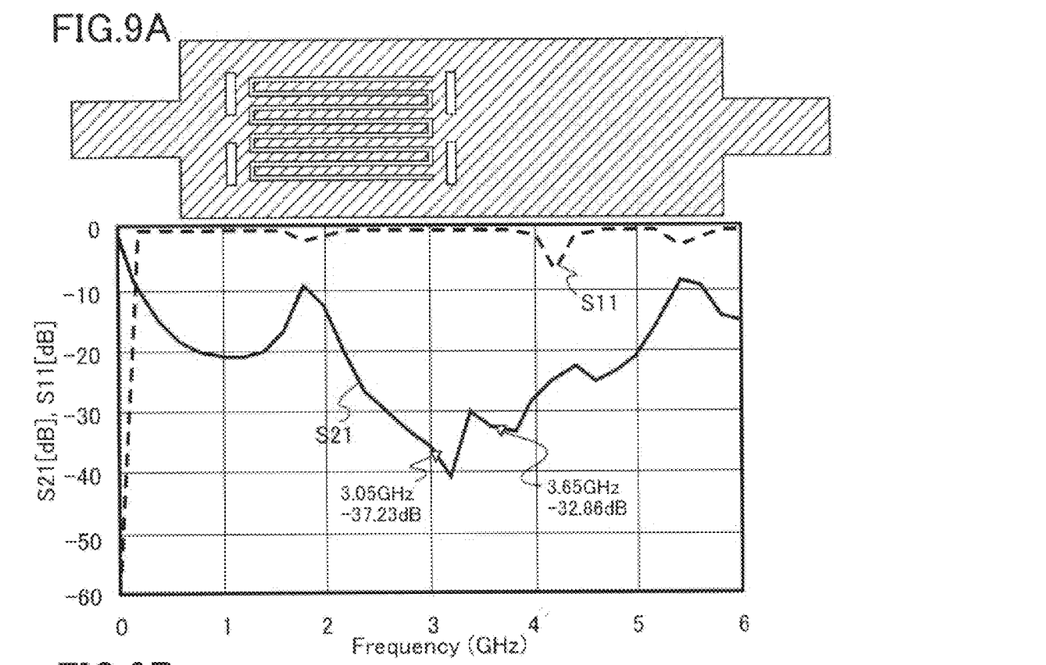
FIGS. 9A to 9B are explanatory views for cutoff characteristics according to the third embodiment.
Figure 9B:
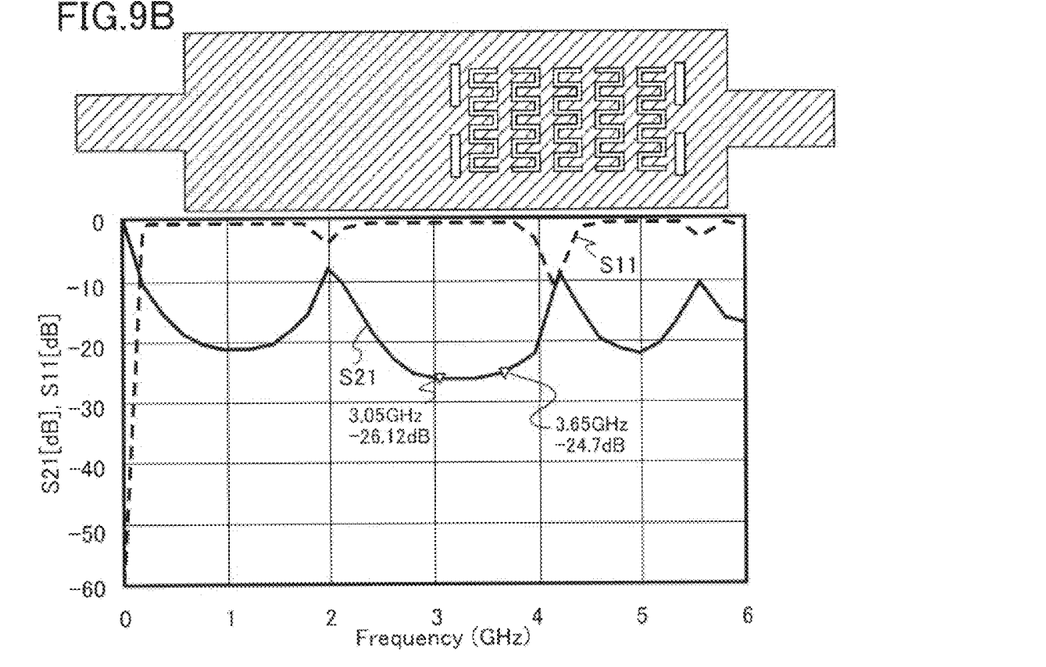

FIGS. 9A to 9B are explanatory views according to the present embodiment. FIG. 9A describes a pattern only with the first EBG pattern (upper side) and its cutoff characteristics (lower side). FIG. 9B describes a pattern only with the second EBG pattern (upper side) and its cutoff characteristics (lower side).

The cutoff characteristics only with the first EBG pattern and those only with the second EBG pattern show different characteristics each other. The cutoff characteristics according to the present embodiment described in FIG. 8 are the sum of those only with the first EBG pattern and those only with the second EBG pattern.

According to the present embodiment, by having different EBG patterns, cutoff characteristics of the sum of them can be realized. Hence, realizing the cutoff characteristics which cannot be realized only with a single pattern can be made possible.

Figure 10A:
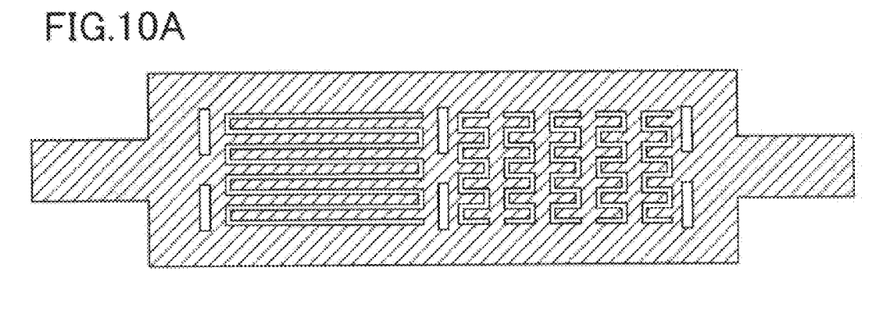
FIGS. 10A to 10C show function of the third embodiment.
Figure 10B:
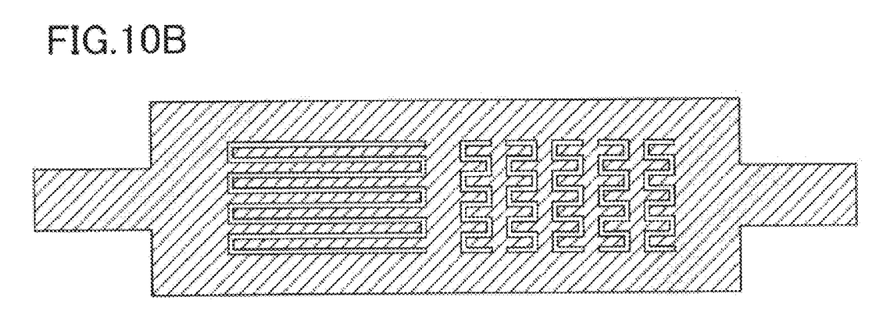
Figure 10C:
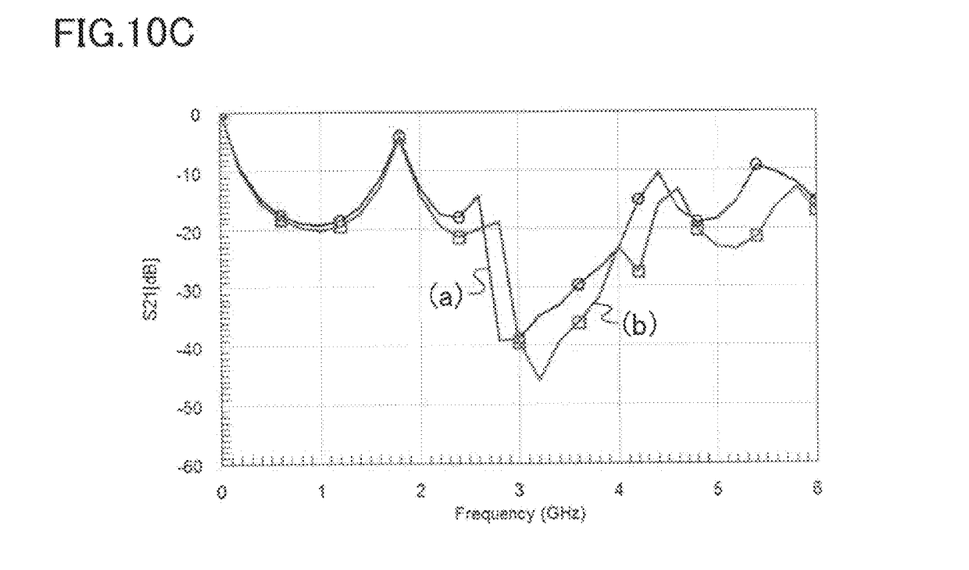

FIGS. 10A to 10C show function of the present embodiment. FIGS. 10A to 10C show function of the slit part 20. FIG. 10A shows a pattern having the slit parts 20 according to the present embodiment, FIG. 10B shows a pattern in which the slit parts 20 are omitted, and FIG. 10C shows the cutoff characteristics of the two. In FIG. 10c, line (a) shows characteristics of EBG pattern of FIG. 10A and line (b) shows characteristics of EBG pattern of FIG. 10B.

As shown in the figure, by providing the slit parts 20, it is seen that the maximum cutoff frequency shifts lower by about 0.4 GHz. In this way, adjusting the cutoff frequency can be made possible by the second slit parts 20.

In the present embodiment, for example, if the parasitic component due to the pattern around the EBG structure causes the shift of the cutoff frequency, adjusting the cutoff frequency to the designed value can be made possible by providing the slit parts 20, without modifying the main first EBG pattern 12 and the third EBG pattern 52.

A Fourth Embodiment

An electronic device according to the present embodiment includes a housing, an electronic circuit disposed in the housing. The electronic circuit includes a power supply line having a first EBG pattern, the first EBG pattern including a plurality of first linear parts and a first slit, each of the first linear parts extending along a direction in which the power supply line extends and surrounded by the first slit except one end of each of the first linear parts. The electronic device according to the present embodiment comprises an electronic circuit comprising the power supply line in the first, second or third embodiment described above. Hereafter, the contents which overlap those of the first embodiment to the third embodiment will be omitted.

Figure 11:
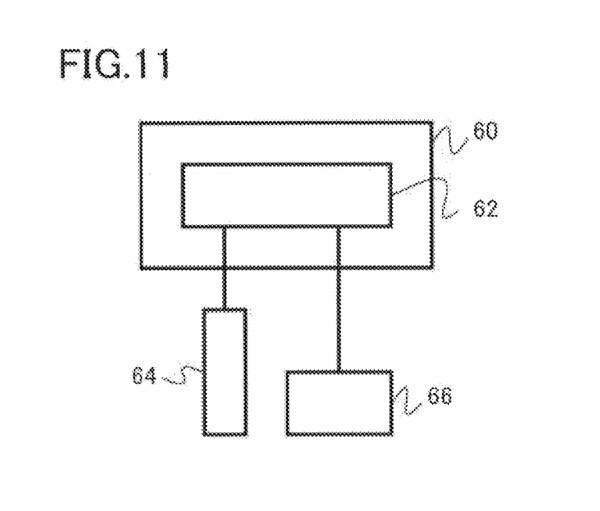
FIG. 11 is a block diagram of an electronic device according to a fourth embodiment.

FIG. 11 is a block diagram of an electronic device according to the present embodiment. The electronic circuit in the present embodiment is, for example, a wireless repeater.

The electronic device according to the present embodiment includes, for example, a circuit board 62 for radio transmission and reception in a housing 60 made of a metal, resin, and so on. In addition, outside of the housing 60, the device has an antenna 64 for radio transmission and reception, and an electric power supply 66 to supply electricity to the circuit board 62.

Figure 12:
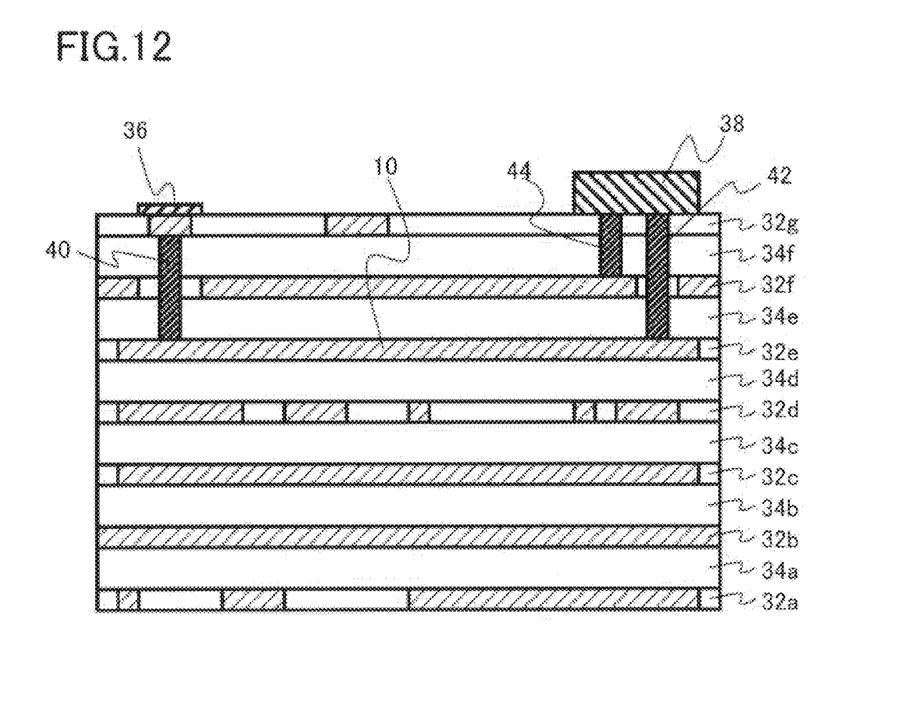
FIG. 12 is a cross sectional schematic view of the electronic circuit according to the fourth embodiment.

FIG. 12 is a cross sectional schematic view of the electronic circuit according to the present embodiment. This electronic circuit is a multilayered circuit board.

The electronic circuit according to the present embodiment is formed by a laminated structure including a plurality of insulating layers and a plurality of conducting layers. The power supply line is formed in one of the conducting layers disposed between two of the insulating layers. In addition, the electronic circuit has an electric power supply input terminal provided on an uppermost layer of the conducting layers, a semiconductor chip mounted on the uppermost layer of the conducting layers, a first connecting conductor electrically connecting the electric power supply input terminal to one end of the power supply line, and a second connecting conductor electrically connecting the semiconductor chip to the other end of the power supply line. The first EBG pattern formed in the other end side of the power supply line.

As shown in FIG. 12, the electronic circuit is formed as a layered structure of a plurality of insulating layers 34a-34f and a plurality of conducting layers 32a-32g. The insulating layers 34a-34f are formed by, for example, a resin. In addition, metal patterns used for an electrical wiring or a reference plane are provided on a plurality of conducting layers 32a-32g.

For example, signal line patterns are formed in a lowermost conducting layer 32a and a uppermost conducting layer 32g. In addition, for example, ground plane, which are also to be reference plane, may be the conducting layers 32b and 32f, and electric power supply line patterns are formed in the conducting layers 32c, 32d, or 32e.

The electric power supply line 10 formed in the conducting layer 32e is, for example, provided with the EBG pattern described in FIG. 1. The conducting layer 32e is disposed between the insulating layer 34d and the insulating layer 34e.

The electric power supply input terminal 36 is provided on the uppermost conducting layer 32g. Furthermore, a semiconductor chip 38 is mounted on the uppermost conducting layer 32g.

In addition, the first connecting conductor 40 which electrically connects the electric power supply input terminal 36 to one end of the power supply line 10 is provided. And the second connecting conductor 42 which electrically connects the semiconductor chip 38 to the other end of the power supply line 10 is provided. The EBG pattern described in FIG. 1 may be formed in the other end side of the power supply line. The EBG pattern described in FIG. 1 is formed in the power supply line 10 close to the second connecting conductor 42. Furthermore, a third connecting conductor 44 which connects the conducting plane 32f, the ground plane, to the semiconductor chip 38 is provided. The first, second, and third connecting conductors are, for example, through vias.

A power supply voltage of 5 to 50 V is, for example, applied to one end of the power supply line 10 from the electric power supply input terminal 36 via the first connecting conductor 40. The power supply voltage applied to the power supply line 10 is applied to the semiconductor chip via the EBG structure provided on the power supply line 10, the other end of the power supply line 10, and the second connecting conductor 42.

Figure 13:
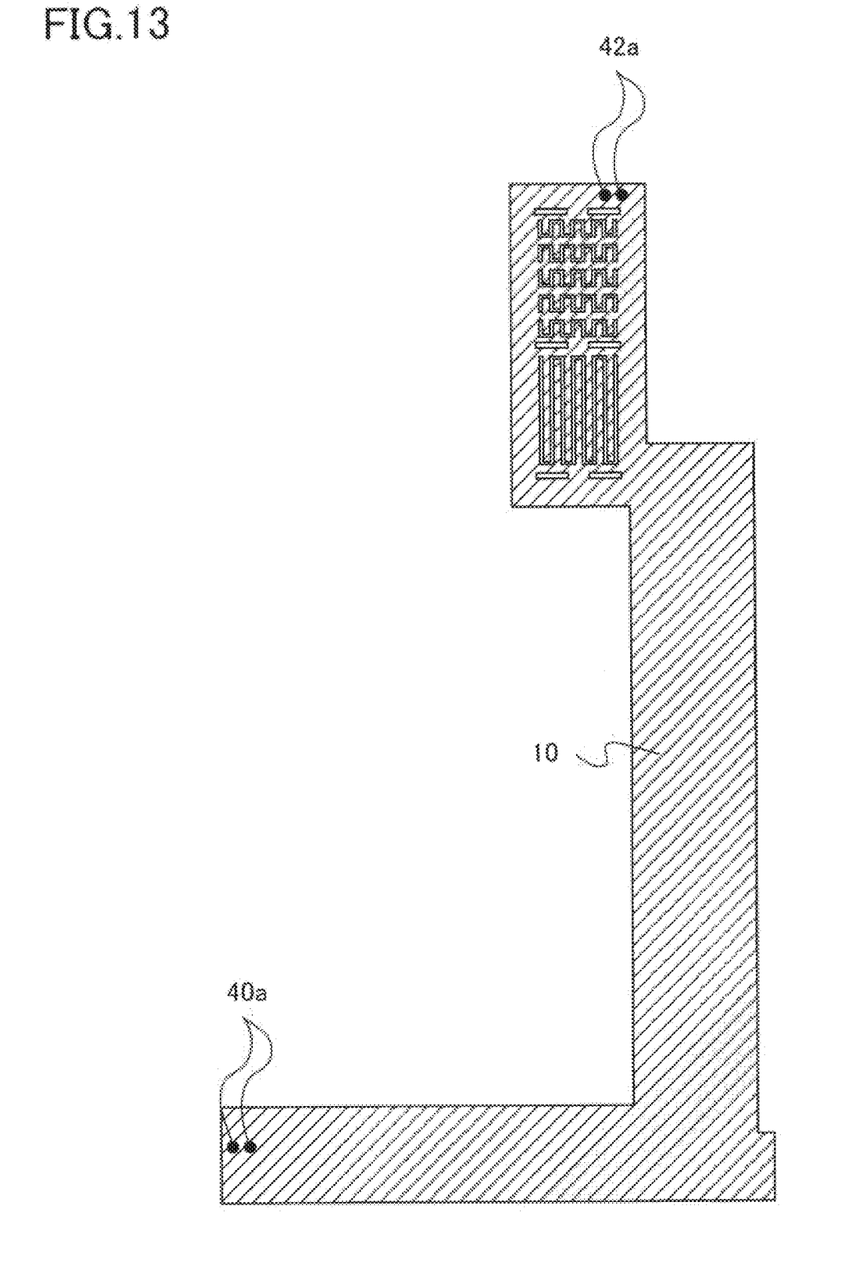
FIG. 13 shows an example of a power supply line and an EBG pattern according to the fourth embodiment.

FIG. 13 shows an example of the power supply line and the EBG pattern according to the present embodiment. For example, the power supply line 10 described in FIG. 13 is formed on the conducting layer 32e described in FIG. 12.

The power supply line 10 has a contact part 40a of the first connecting conductor 40 on one side, and a contact part 42a of the second connecting conductor 42 on the other side, and the EBG structure is disposed between them. For example, 50V of the power of the electric power supply is applied to the power supply line 10 from the electric power supply input terminal 36 via the first connecting conductor 40 and the contact part 40a.

Figure 14:
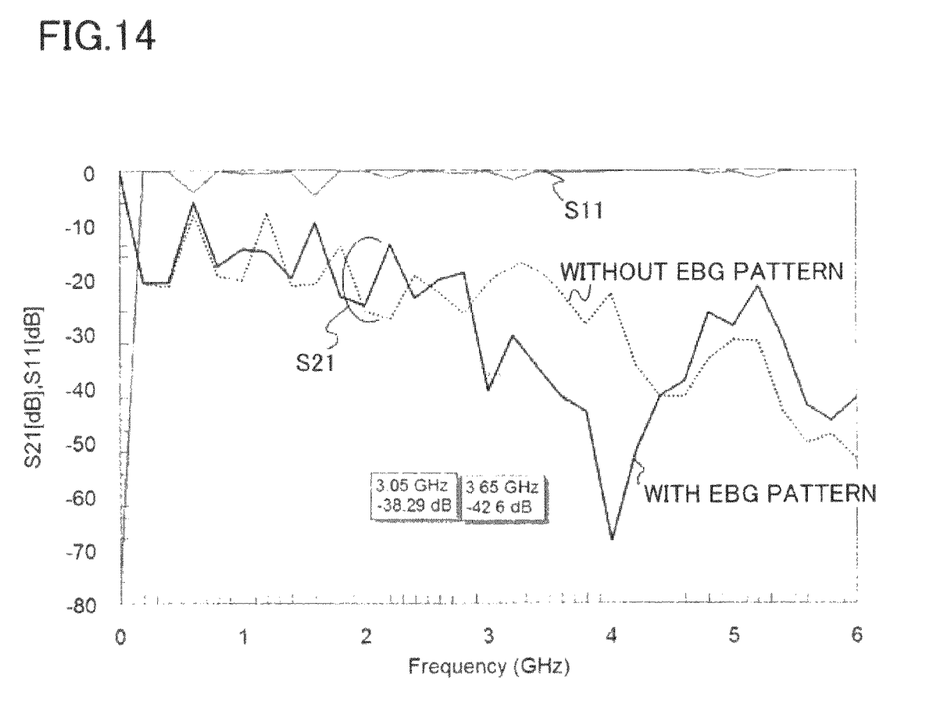
FIG. 14 shows cutoff characteristics according to the fourth embodiment.

FIG. 14 shows the cutoff characteristics according to the present embodiment. The pattern of the power supply line 10 shown in FIG. 13 is employed. The cutoff characteristics between those with an EBG pattern and without an EBG pattern are compared.

If the EBG pattern is not provided (dotted line in FIG. 14), the amount of cutoff is −20 dB and −25 dB for noise frequency of 3.05 GHz and 3.65 GHz, which may cause the noise to transmit. On the other hand, if the EBG pattern according to the present embodiment is provided (solid line in FIG. 14), the transmission of the noise is reduced since the amount of cutoff is −38.29 dB for the noise frequency 3.05 GHz, and −42.6 dB for 3.65 GHz.

According to the present embodiment, an electronic circuit with small and reduced malfunction due to the noise transmitting on the power supply line is realized. Thus, by installing this electronic circuit, an electronic device with small and reduced malfunction due to the noise transmitting on the power supply line is realized.

While certain embodiments have been described, these embodiments have been presented by way of example only, and are not intended to limit the scope of the inventions. Indeed, the electronic circuit and the electronic device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An electronic circuit comprising:
a power supply line having a first EBG pattern, the first EBG (Electromagnetic Band Gap) pattern including a plurality of first linear parts and a first slit, each of the first linear parts extending along a direction in which the power supply line extends and surrounded by the first slit except one end of each of the first linear parts,
wherein the power supply line has slit parts interposing the first EBG pattern in between, each of the slit parts having a pair of slits, the pair of slits arranged substantially perpendicular to the direction in which the power supply line extends, and each of the pair of slits extending substantially perpendicular to the direction in which the power supply line extends.

2. The circuit according to claim 1, wherein the first linear parts are arranged in a direction substantially perpendicular to the direction in which the power supply line extends.

3. The circuit according to claim 1, wherein the power supply line has a second EBG pattern, the second EBG pattern having identical pattern as the first EBG pattern, the first EBG pattern and the second EBG pattern arranged along the direction in which the power supply line extends.

4. The circuit according to claim 1, wherein the power supply line has a third EBG pattern, the third EBG part including a plurality of second linear parts and a second slit, each of the second linear parts extending along a direction in which the power supply line extends and surrounded by the second slit except one end of each of the second linear parts, length of second linear parts being different from that of the first linear parts, and the first EBG pattern and the third EBG pattern arranged along the direction in which the power supply line extends.

5. The circuit according to claim 1, further comprising a ground plane spaced apart from the power supply line and formed by an electric conductor.

6. The circuit according to claim 1, wherein the electronic circuit is formed by a laminated structure including a plurality of insulating layers and a plurality of conducting layers, and the power supply line is formed in one of the conducting layers disposed between two of the insulating layers.

7. The circuit according to claim 6, further comprising an electric power supply input terminal provided on an uppermost layer of the conducting layers, a semiconductor chip mounted on the uppermost layer of the conducting layers, a first connecting conductor electrically connecting the electric power supply input terminal to one end of the power supply line, and a second connecting conductor electrically connecting the semiconductor chip to the other end of the power supply line, the first EBG pattern formed in the other end side of the power supply line.

8. An electronic device comprising:
a housing; and
an electronic circuit disposed in the housing,
the electronic circuit including a power supply line having a first EBG (Electromagnetic Band Gap) pattern, the first EBG pattern including a plurality of first linear parts and a first slit, each of the first linear parts extending along a direction in which the power supply line extends and surrounded by the first slit except one end of each of the first linear parts,
wherein the power supply line has slit parts interposing the first EBG pattern in between, each of the slit parts having a pair of slits, the pair of slits arranged substantially perpendicular to the direction in which the power supply line extends, and each of the pair of slits extending substantially perpendicular to the direction in which the power supply line extends.

9. The device according to claim 8, wherein the first linear parts are arranged in a direction substantially perpendicular to the direction in which the power supply line extends.

10. The device according to claim 8, wherein the power supply line has a second EBG pattern, the second EBG pattern having identical pattern as the first EBG pattern, the first EBG pattern and the second EBG pattern arranged along the direction in which the power supply line extends.

11. The device according to claim 8, wherein the power supply line has a third EBG pattern, the third EBG part including a plurality of second linear parts and a second slit, each of the second linear parts extending along a direction in which the power supply line extends and surrounded by the second slit except one end of each of the second linear parts, the length of second linear parts being different from that of the first linear parts, and the first EBG pattern and the third EBG pattern arranged along the direction in which the power supply line extends.

12. The device according to claim 8, further comprising a ground plane spaced apart from the power supply line and formed by an electric conductor.

13. The device according to claim 8, wherein the electronic circuit is formed by a laminated structure including a plurality of insulating layers and a plurality of conducting layers, and the power supply line is formed in one of the conducting layers disposed between two of the insulating layers.

14. The device according to claim 13, further comprising an electric power supply input terminal provided on an uppermost layer of the conducting layers, a semiconductor chip mounted on the uppermost layer of the conducting layers, a first connecting conductor electrically connecting the electric power supply input terminal to one end of the power supply line, and a second connecting conductor electrically connecting the semiconductor chip to the other end of the power supply line, the first EBG pattern formed in the other end side of the power supply line.

* * * * *